United States Patent
Lin et al.

(10) Patent No.: US 12,051,724 B2
(45) Date of Patent: Jul. 30, 2024

(54) SEMICONDUCTOR EPITAXY STRUCTURE

(71) Applicant: GlobalWafers Co., Ltd., Hsinchu (TW)

(72) Inventors: Tzu-Yao Lin, Hsinchu (TW); Jia-Zhe Liu, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 32 days.

(21) Appl. No.: 17/827,805

(22) Filed: May 30, 2022

(65) Prior Publication Data
US 2023/0138899 A1 May 4, 2023

(30) Foreign Application Priority Data
Oct. 29, 2021 (TW) .................... 110140295

(51) Int. Cl.
*H01L 29/15* (2006.01)
*H01L 29/267* (2006.01)
(52) U.S. Cl.
CPC .......... *H01L 29/158* (2013.01); *H01L 29/267* (2013.01)
(58) Field of Classification Search
CPC ............. H01L 21/02507; H01L 29/151; H01L 29/152; H01L 29/15
See application file for complete search history.

(56) References Cited

U.S. PATENT DOCUMENTS

| | | | |
|---|---|---|---|
| 6,847,046 B1* | 1/2005 | Wei | H01L 21/02488 257/190 |
| 2014/0001438 A1* | 1/2014 | Kim | H01L 21/02447 257/18 |
| 2015/0333125 A1* | 11/2015 | Loboda | H01L 21/02532 257/77 |
| 2019/0157080 A1* | 5/2019 | Lin | H01L 29/205 |
| 2021/0119419 A1* | 4/2021 | Dadgar | H01S 5/2227 |

FOREIGN PATENT DOCUMENTS

| | | |
|---|---|---|
| CN | 102851734 | 11/2015 |
| CN | 106299059 | 1/2017 |

* cited by examiner

*Primary Examiner* — Raj R Gupta
(74) *Attorney, Agent, or Firm* — JCIPRNET

(57) ABSTRACT

A semiconductor epitaxy structure includes a silicon carbide substrate, a nucleation layer, a gallium nitride buffer layer, and a stacked structure. The nucleation layer is formed on the silicon carbide substrate, the gallium nitride buffer layer is disposed on the nucleation layer, and the stacked structure is formed between the nucleation layer and the gallium nitride buffer layer. The stacked structure includes: a plurality of silicon nitride ($SiN_x$) layers and a plurality of aluminum gallium nitride ($Al_xGa_{1-x}N$) layers alternately stacked, wherein the first layer of the plurality of silicon nitride layers is in direct contact with the nucleation layer.

10 Claims, 3 Drawing Sheets

SEMICONDUCTOR EPITAXY STRUCTURE

CROSS-REFERENCE TO RELATED APPLICATION

This application claims the priority benefit of Taiwanese application serial no. 110140295, filed on Oct. 29, 2021. The entirety of the above-mentioned patent application is hereby incorporated by reference herein and made a part of this specification.

BACKGROUND OF THE INVENTION

Field of the Invention

The invention relates to a semiconductor epitaxy structure, and in particular, to a semiconductor epitaxy structure formed by epitaxy of a silicon carbide substrate.

Description of Related Art

Semiconductor epitaxy techniques have been widely used in the fabrication of various semiconductor elements. In order to improve epitaxy quality, there is currently a technique adopting a silicon carbide (SiC) substrate for an epitaxy process. Moreover, in order to withstand lattice stress caused by lattice mismatch, a thicker silicon carbide substrate is often adopted.

Due to the very difficult growth of monocrystalline silicon carbide, prime silicon carbide substrates are still in short supply. Therefore, if down-grade substrates may be used instead of prime substrates, not only may costs be reduced, but the number of available substrates may also be increased.

However, using a down-grade substrate means that the substrate has many defects, thus readily causing poor epitaxy quality.

SUMMARY OF THE INVENTION

The invention provides a semiconductor epitaxy structure that may solve the stress issue of the epitaxy layer and improve the quality of the epitaxy layer while reducing the cost of the substrate.

A semiconductor epitaxy structure of the invention includes a silicon carbide substrate, a nucleation layer, a gallium nitride buffer layer, and a stacked structure. The nucleation layer is formed on the silicon carbide substrate, the gallium nitride buffer layer is disposed on the nucleation layer, and the stacked structure is formed between the nucleation layer and the gallium nitride buffer layer. The stacked structure includes a plurality of silicon nitride ($SiN_x$) layers and a plurality of aluminum gallium nitride ($Al_xGa_{1-x}N$) layers alternately stacked, wherein a first layer of the plurality of silicon nitride layers is in direct contact with the nucleation layer.

In an embodiment of the invention, the stacked structure is formed by N or (N+1) of the silicon nitride layers and N of the aluminum gallium nitride layers, wherein N is an integer of 2 or more.

In an embodiment of the invention, a thickness of each of the plurality of silicon nitride layers is gradually reduced from the nucleation layer to the gallium nitride buffer layer.

In an embodiment of the invention, each of the plurality of aluminum gallium nitride layer has a uniform aluminum content, and the aluminum content is reduced layer by layer from the nucleation layer to the gallium nitride buffer layer.

In an embodiment of the invention, a thickness of the first layer in the plurality of silicon nitride layers is between 20 nm and 100 nm.

In an embodiment of the invention, the nucleation layer is an aluminum nitride (AlN) nucleation layer, and has a thickness between 50 nm and 200 nm.

In an embodiment of the invention, the stacked structure is formed by a plurality of superlattice (SLs) layers, each of the superlattice layers is formed by one of the silicon nitride layers and one of the aluminum gallium nitride layers, the aluminum gallium nitride layer is formed by a first aluminum gallium nitride thin film and a second aluminum gallium nitride thin film, and the first aluminum gallium nitride thin film is located between the second aluminum gallium nitride thin film and the silicon nitride layer.

In an embodiment of the invention, the stacked structure accounts for 40% to 60% of a total thickness of the semiconductor epitaxy structure.

In an embodiment of the invention, a ratio of a thickness of the first aluminum gallium nitride thin film to a thickness of the second aluminum gallium nitride thin film is 1:2 to 1:10.

In an embodiment of the invention, an aluminum content of the first aluminum gallium nitride thin film is higher than an aluminum content of the second aluminum gallium nitride thin film.

In an embodiment of the invention, a thickness of each of the superlattice layers is between 20 nm and 50 nm.

In an embodiment of the invention, a thickness of the silicon nitride layer in the superlattice layer is between 1 nm and 20 nm.

In an embodiment of the invention, the nucleation layer is an aluminum nitride (AlN) nucleation layer, and has a thickness between 1 nm and 100 nm.

In an embodiment of the invention, a thickness of the silicon carbide substrate is between 100 μm and 350 μm.

In an embodiment of the invention, a basal plane dislocation (BPD) density of the silicon carbide substrate is between 3000 $cm^{-2}$ and 6000 $cm^{-2}$.

Based on the above, the invention adopts a thinner silicon carbide substrate with more defects that is used in conjunction with a specific stacked structure between the nucleation layer and the gallium nitride buffer layer, so as to prevent defects from affecting the grown epitaxy layer, so that dislocation of the epitaxy layer is reduced. In this way, epitaxy quality is improved, and cost considerations are also taken into account.

In order to make the aforementioned features and advantages of the disclosure more comprehensible, embodiments accompanied with figures are described in detail below.

DESCRIPTION OF THE EMBODIMENTS

Figure 1A:
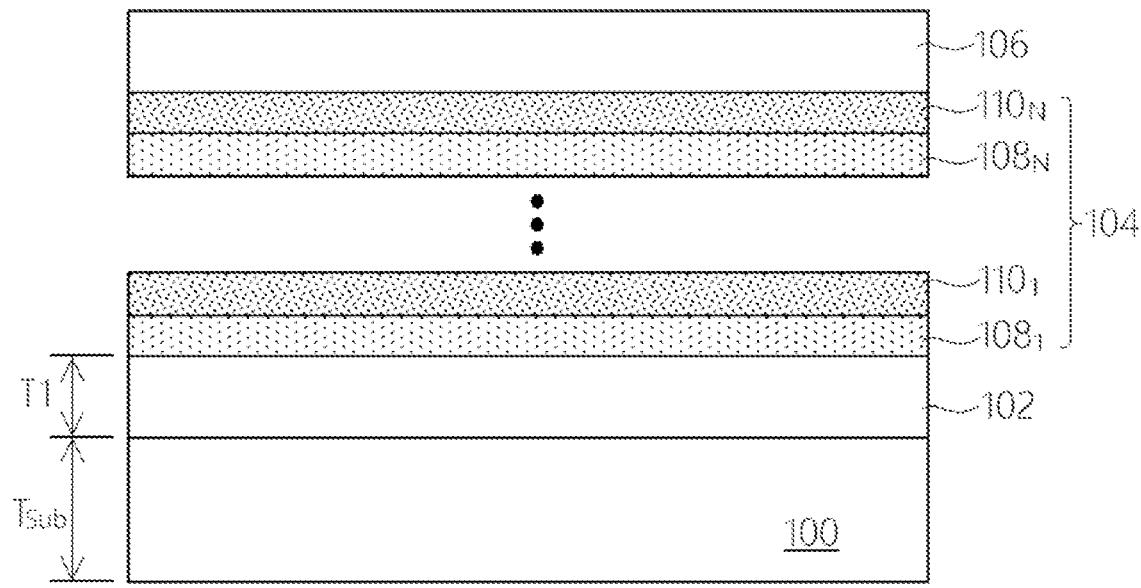
FIG. 1A is a cross-sectional view of a semiconductor epitaxy structure according to the first embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

FIG. 1A is a cross-sectional view of a semiconductor epitaxy structure according to the first embodiment of the invention.

Figure 1B:
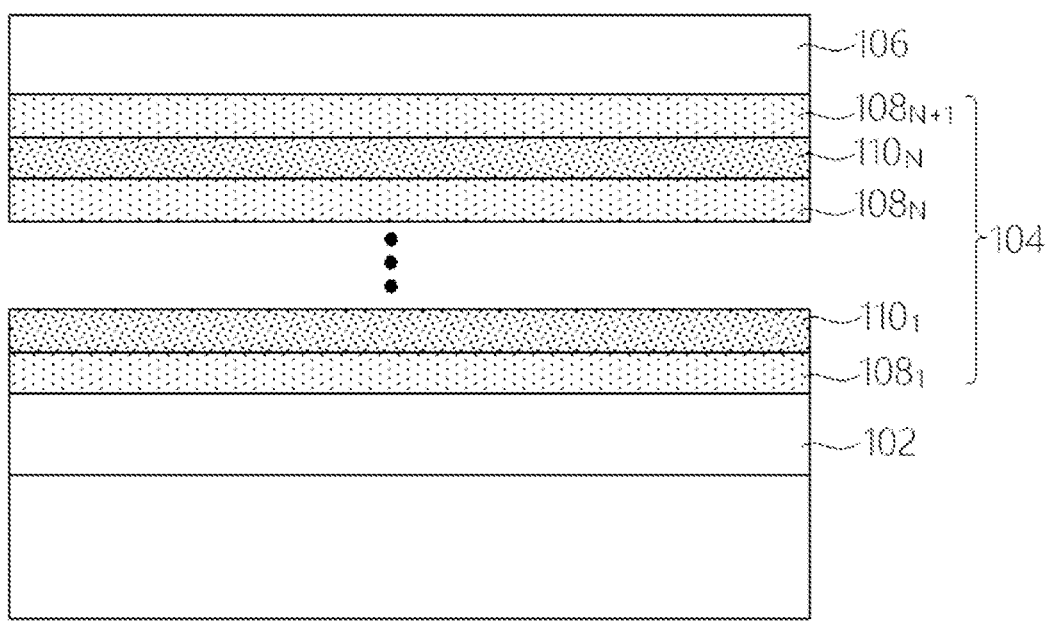
FIG. 1B is a cross-sectional view of another semiconductor epitaxy structure of the first embodiment.

Referring to FIG. 1A, a semiconductor epitaxy structure 10a includes a silicon carbide substrate 100, a nucleation layer 102, a stacked structure 104, and a gallium nitride buffer layer 106. The nucleation layer 102 is formed on the silicon carbide substrate 100, the gallium nitride buffer layer 106 is disposed on the nucleation layer 102, and the stacked structure 104 is formed between the nucleation layer 102 and the gallium nitride buffer layer 106. The stacked structure 104 includes a plurality of silicon nitride ($SiN_x$) layers $108_{1\ to\ N}$ and a plurality of aluminum gallium nitride ($Al_xGa_{1-x}N$) layers $110_{1\ to\ N}$ alternately stacked, wherein the first layer $108_1$ in the plurality of silicon nitride layers $108_{1\ to\ N}$ is in direct contact with the nucleation layer. In the first embodiment, the stacked structure 104 may be formed by N of the silicon nitride layers $108_{1\ to}$ N and N of the aluminum gallium nitride layers $110_{1\ to\ N}$; alternatively, as shown in a semiconductor epitaxy structure 10b of FIG. 1B, the stacked structure 104 is formed by (N+1) of the silicon nitride layers $108_{1\ to\ N+1}$ and N of the aluminum gallium nitride layers $110_{1\ to\ N}$. N refers to an integer of 2 or more, such as 3 or more, 4 or more, and the like. Due to the presence of the stacked structure 104, defects may be effectively blocked from affecting a subsequent epitaxially-grown film layer, so that dislocation of the epitaxy layer is reduced, thus facilitating the application of the semiconductor epitaxy structure 10a in an epitaxially-grown semiconductor element.

In the present embodiment, each of the plurality of aluminum gallium nitride layers $110_{1\ to\ N}$ may have a uniform aluminum content, and the aluminum content is reduced layer by layer from the nucleation layer 102 to the gallium nitride buffer layer 106, so that the lattice constant and energy gap may be in a step or continuous state, such that the lattice constant and energy gap of the aluminum gallium nitride layers $110_{1\ to\ N}$ are close to those of the upper gallium nitride buffer layer 106. In other words, the aluminum content of the first layer of the aluminum gallium nitride layer $110_1$ is the highest in the plurality of aluminum gallium nitride layers $110_{1-N}$ (e.g., AlN), and the aluminum content of the Nth aluminum gallium nitride layer $110_N$ is the lowest (e.g., GaN) in the plurality of aluminum gallium nitride layers $110_{1-N}$; and so on.

Please continue to refer to FIG. 1A, a thickness $T_{sub}$ of the silicon carbide substrate 100 of the first embodiment may be between 100 μm and 350 μm, for example, between 150 μm and 300 μm, preferably between 175 μm and 275 μm. Since the first embodiment has the stacked structure 104 capable of adjusting stress and blocking defects, a thinner substrate than the previous silicon carbide substrate with a thickness reaching 500 μm or more may be used, so that costs may be significantly reduced. The silicon carbide substrate 100 may include a monocrystalline silicon carbide substrate, an N-type silicon carbide substrate, or a semi-insulating (SI) silicon carbide substrate. In the present embodiment, due to the presence of the stacked structure 104, a down-grade silicon carbide substrate may be selected without affecting the subsequent epitaxially-grown film layer. Therefore, the silicon carbide substrate 100 may have a higher basal plane dislocation (BPD) density, for example, between 3000 $cm^{-2}$ and 6000 $cm^{-2}$, or between 3000 $cm^{-2}$ and 5000 $cm^{-2}$, or even between 3000 $cm^{-2}$ and 4500 $cm^{-2}$. The nucleation layer 102, such as an aluminum nitride (AlN) nucleation layer, has a thickness T1 between 50 nm and 200 nm, such as a thickness T1 between 100 nm and 200 nm, and preferably, the thickness T1 is between 150 nm and 200 nm. The material of the gallium nitride buffer layer 106 is, for example, doped carbon gallium nitride (C:GaN) or doped iron gallium nitride (Fe:GaN).

Figure 2:
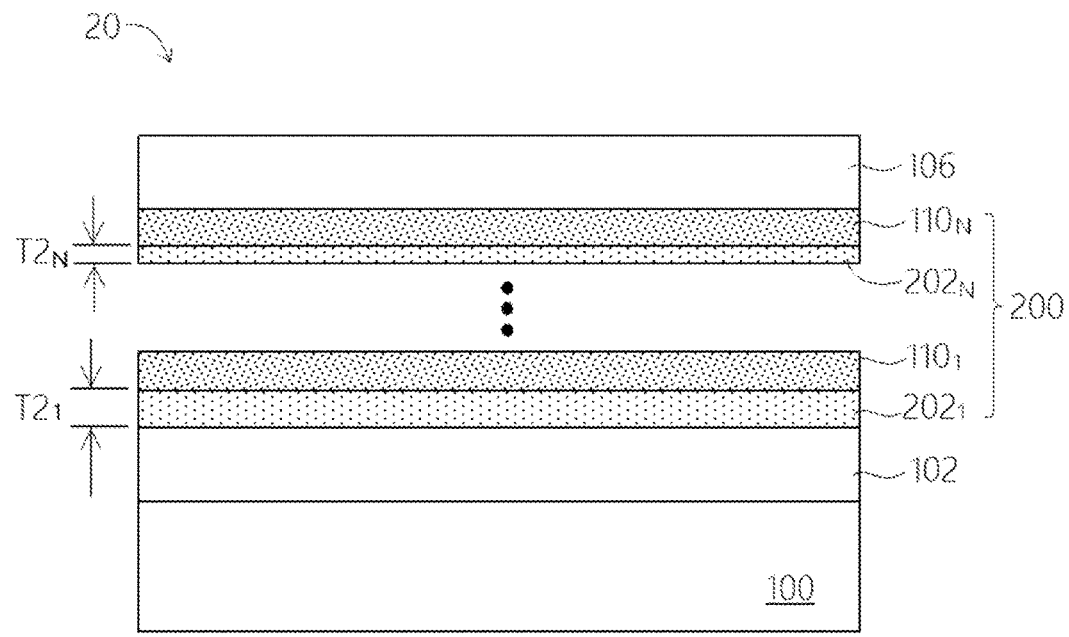
FIG. 2 is a cross-sectional view of a semiconductor epitaxy structure according to the second embodiment of the invention.

FIG. 2 is a cross-sectional view of a semiconductor epitaxial structure according to the second embodiment of the invention, wherein the same reference numerals as those in the first embodiment are used to denote the same or similar portion, structure, or dimension definitions, and the description of the same portion, structure, or dimension definitions is as provided in the first embodiment and is not repeated herein.

Referring to FIG. 2, a semiconductor epitaxy structure 20 of the second embodiment includes the silicon carbide substrate 100, the nucleation layer 102, a stacked structure 200, and the gallium nitride buffer layer 106, wherein the silicon carbide substrate 100, the nucleation layer 102, and the gallium nitride buffer layer 106 are as provided in the description in the first embodiment. The stacked structure 200 also includes a plurality of silicon nitride ($SiN_x$) layers $202_{1\ to\ N}$ and a plurality of aluminum gallium nitride ($Al_xGa_{1-x}N$) layers $110_{1\ to\ N}$ alternately stacked, and the first silicon nitride layer $202_1$ is in direct contact with the nucleation layer 102. The difference between the semiconductor epitaxy structure 20 and the first embodiment is that the thickness of each of the plurality of silicon nitride layers $202_{1\ to\ N}$ is gradually reduced from the nucleation layer 102 to the gallium nitride buffer layer 106. Since the bottom layer may have more defects, a thick bottom layer may prevent the flatness of the epitaxial surface from being affected, and therefore the bottom layer is thick and may be thinner toward the gallium nitride buffer layer 106. In other words, a thickness $T2_1$ of the first silicon nitride layer $202_1$ is greatest, and is, for example, between 20 nm and 100 nm, preferably between 30 nm and 100 nm, and more preferably between 40 nm and 100 nm. If the thickness $T2_1$ is greater than 100 nm, there may be a surface roughness issue; if the thickness $T2_1$ is less than 20 nm, defect blocking effect may be worse. However, the invention is not limited thereto, and the thickness $T2_1$ may be adjusted according to the total thickness of the epitaxial growth. The less the total thickness, the thinner the grown first silicon nitride layer $202_1$. Moreover, a thickness $T2_N$ of the Nth silicon nitride layer $202_N$ is least, and is, for example, between 1 nm and 20 nm, preferably between 1 nm and 15 nm, and more preferably between 1 nm and 10 nm. In another embodiment, if the stacked structure 200 has N+1 of the silicon nitride layers $202_{1\ to\ N+1}$, a thickness $T2_{N+1}$ of the N+1 silicon nitride layer $202_{N+1}$ is the least, and so on.

Figure 3:
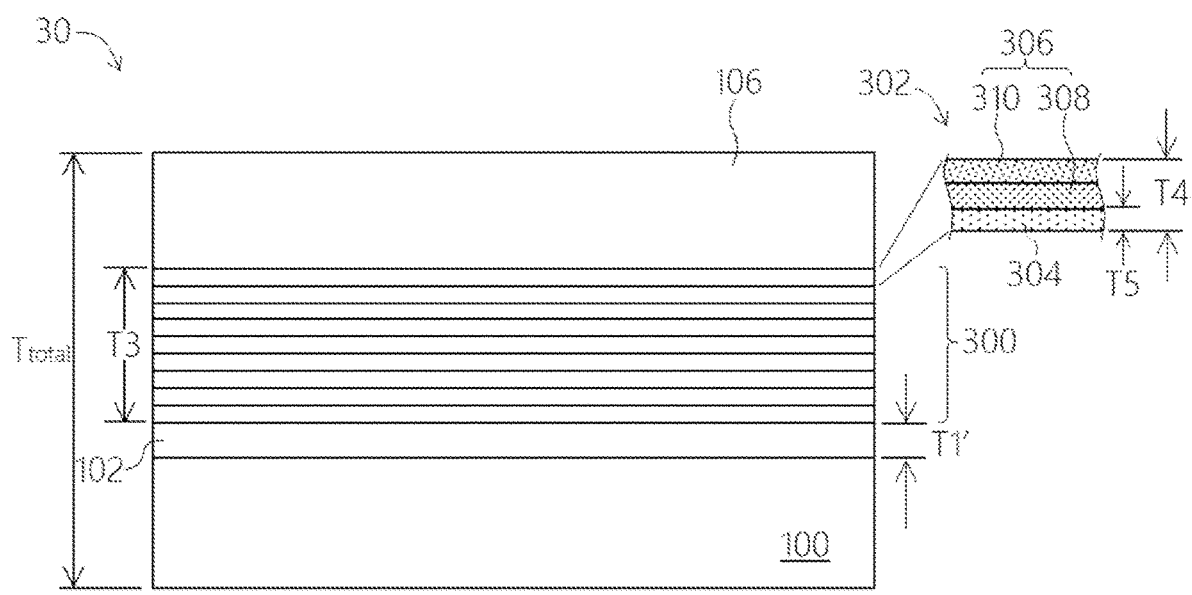
FIG. 3 is a cross-sectional view of a semiconductor epitaxy structure according to the third embodiment of the invention.

FIG. 3 is a cross-sectional view of a semiconductor epitaxial structure according to the third embodiment of the invention, wherein the same reference numerals as those in the first embodiment are used to denote the same or similar portion, structure, or dimension definitions, and the description of the same portion, structure, or dimension definitions is as provided in the first embodiment and is not repeated herein.

Referring to FIG. 3, a semiconductor epitaxy structure 30 of the third embodiment includes the silicon carbide substrate 100, the nucleation layer 102, a stacked structure 300, and the gallium nitride buffer layer 106, wherein the silicon carbide substrate 100, the nucleation layer 102, and the gallium nitride buffer layer 106 are as provided in the description in the first embodiment. The stacked structure 300 is formed by a plurality of superlattice (SLs) layers 302, each of the superlattice layers 302 is formed by one silicon nitride ($SiN_x$) layer 304 and one aluminum gallium nitride ($Al_xGa_{1-x}N$) layer 306, the aluminum gallium nitride layer 306 is formed by a first aluminum gallium nitride thin film 308 and a second aluminum gallium nitride thin film 310, and the first aluminum gallium nitride thin film 308 is located between the second aluminum gallium nitride thin film 310 and the silicon nitride layer 304, wherein the aluminum content of the first aluminum gallium nitride thin film 308 is, for example, higher than the aluminum content of the second aluminum gallium nitride thin film 310. In other words, in each of the superlattice layers 302, the aluminum content of the first aluminum gallium nitride thin film 308 close to the nucleation layer 102 is higher, the aluminum content of the second aluminum gallium nitride thin film 310 close to the gallium nitride buffer layer 106 is lower, and the aluminum content of the first aluminum gallium nitride thin film 308 is, for example, between 50% and 100%, preferably between 60% and 100%, and more preferably between 70% and 100%; the aluminum content of the second aluminum gallium nitride thin film 310 is, for example, between 0% and 50%, preferably between 0% and 40%, and more preferably between 0% and 30%.

Figure 4A:
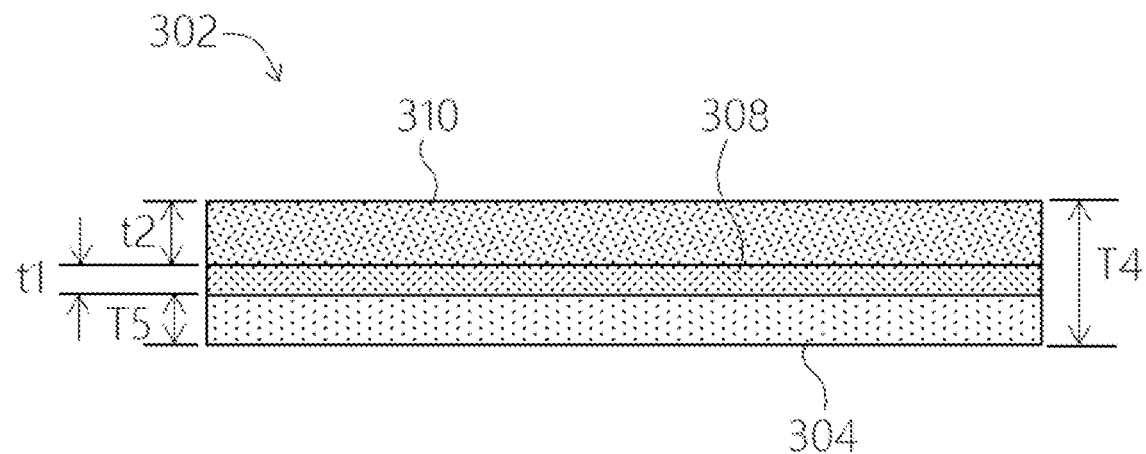
FIG. 4A is a cross-sectional view of a superlattice layer in the semiconductor epitaxy structure of the third embodiment.
Figure 4B:
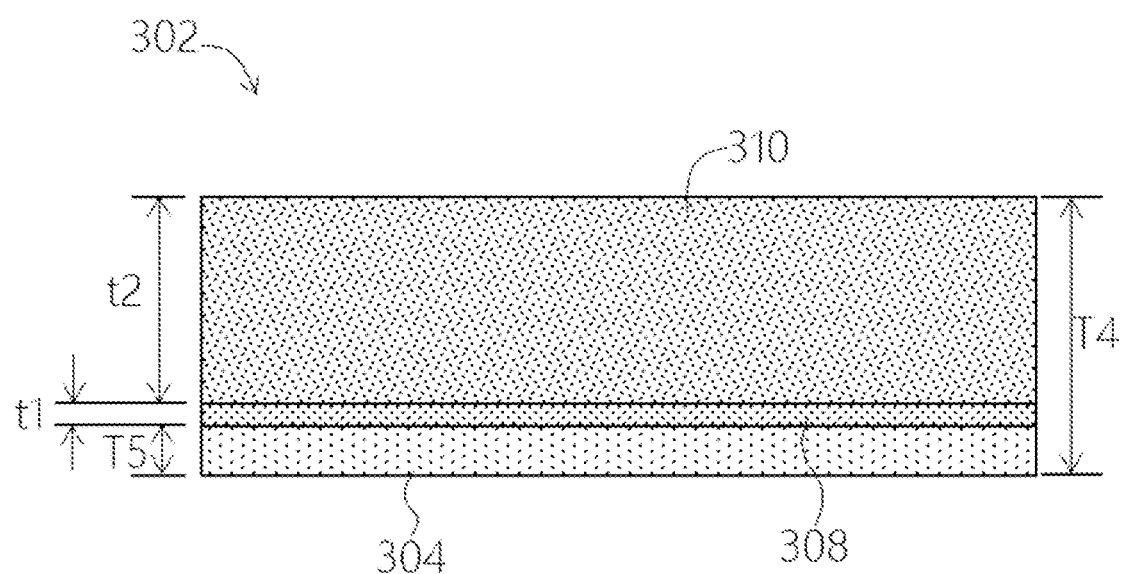
FIG. 4B is a cross-sectional view of another superlattice layer in the semiconductor epitaxy structure of the third embodiment.

In the present embodiment, a thickness T3 of the stacked structure 300 accounts for 40% to 60% of a total thickness $T_{total}$ of the semiconductor epitaxy structure 30, such as 40% to 55%, preferably 40% to 50%. The stacked structure 300 is mainly used for adjusting stress and improving withstand voltage, and therefore if the ratio of the thickness T3 to the total thickness $T_{total}$ is less than 40%, the withstand voltage and stress may be impacted; more than 60% has the disadvantage that the epitaxy time is too long. A thickness T4 of each of the superlattice layers 302 may be between 20 nm and 50 nm to better control stress, for example, between 20 nm and 40 nm, preferably between 20 nm and 30 nm. A thickness T5 of the silicon nitride layer 304 in each of the superlattice layers 302 may be between 1 nm and 20 nm, for example, between 5 nm and 20 nm, preferably between 10 nm and 20 nm. Moreover, the thickness T5 may also be reduced toward the gallium nitride buffer layer 106 to prevent the surface from readily becoming rough. The ratio of a thickness t1 of the first aluminum gallium nitride thin film 308 to a thickness t2 of the second aluminum gallium nitride thin film 310 may be 1:2 to 1:10. For example, FIG. 4A shows that the ratio of the thickness t1 to the thickness t2 of one of the superlattice layers 302 is about 1:2, and FIG. 4B shows that the ratio of the thickness t1 to the thickness t2 of one of the superlattice layers 302 is about 1:10. Since the first aluminum gallium nitride thin film 308 in each of the superlattice layers 302 has a higher aluminum content close to the nucleation layer 102 and the second aluminum gallium nitride thin film 310 close to the gallium nitride buffer layer 106 has a lower aluminum content, the closer the ratio of the thickness t1 to the thickness t2 is to 1:2, the thicker the second aluminum gallium nitride thin film 310 (close to GaN) with lower aluminum content is, which is beneficial to epitaxy quality; conversely, the closer the ratio of the thickness t1 to the thickness t2 is to 1:10, the thicker the first aluminum gallium nitride film 308 with higher aluminum content is, which is beneficial to stress control.

Since the stacked structure 300 is formed by the plurality of superlattice layers 302, and a superlattice structure has stronger modulation ability, compared with the structures of the first and second embodiments, the semiconductor epitaxy structure 30 of the third embodiment is more suitable for adopting a down-grade silicon carbide substrate as the silicon carbide substrate 100. Moreover, a thickness T1' of the nucleation layer 102 may also be less than the nucleation layers in the first and second embodiments, and the thickness T1' of the nucleation layer 102 is, for example, between 1 nm and 100 nm, preferably between 5 nm and 100 nm, and more preferably between 10 nm and 100 nm.

Based on the above, the semiconductor epitaxy structure of the invention may adopt a thinner silicon carbide substrate with more defects, and therefore the cost of the substrate is significantly reduced. At the same time, the semiconductor epitaxy structure of the invention also has a specific stacked structure located between the nucleation layer and the gallium nitride buffer layer to prevent defects from affecting the subsequently grown epitaxy layer, so that dislocation of the epitaxy layer is reduced. In this way, epitaxy quality is improved, and cost considerations are also taken into account.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A semiconductor epitaxy structure, comprising:
   a silicon carbide substrate;
   a nucleation layer formed on the silicon carbide substrate;
   a gallium nitride buffer layer disposed on the nucleation layer; and
   a stacked structure formed between the nucleation layer and the gallium nitride buffer layer, and the stacked structure is formed by a plurality of superlattice (SLs) layers, each of the superlattice layers is formed by one of the silicon nitride layers and one of the aluminum gallium nitride layers, the aluminum gallium nitride layer is formed by a first aluminum gallium nitride thin film and a second aluminum gallium nitride thin film, and the first aluminum gallium nitride thin film is located between the second aluminum gallium nitride thin film and the silicon nitride layer, and an aluminum content of the first aluminum gallium nitride thin film is higher than an aluminum content of the second aluminum gallium nitride thin film.

2. The semiconductor epitaxy structure of claim 1, wherein the stacked structure accounts for 40% to 60% of a total thickness of the semiconductor epitaxy structure.

3. The semiconductor epitaxy structure of claim 1, wherein a ratio of a thickness of the first aluminum gallium nitride thin film to a thickness of the second aluminum gallium nitride thin film is 1:2 to 1:10.

4. The semiconductor epitaxy structure of claim 1, wherein a thickness of each of the superlattice layers is between 20 nm and 50 nm.

5. The semiconductor epitaxy structure of claim 1, wherein a thickness of the silicon nitride layer in the superlattice layers is between 1 nm and 20 nm.

6. The semiconductor epitaxy structure of claim 1, wherein the nucleation layer is an aluminum nitride (AlN) nucleation layer, and has a thickness between 1 nm and 100 nm.

7. The semiconductor epitaxy structure of claim 1, wherein a thickness of the silicon carbide substrate is between 100 μm and 350 μm.

8. The semiconductor epitaxy structure of claim 1, wherein a basal plane dislocation (BPD) density of the silicon carbide substrate is between 3000 $cm^{-2}$ and 6000 $cm^{-2}$.

9. A semiconductor epitaxy structure, comprising:
- a silicon carbide substrate;
- a nucleation layer formed on the silicon carbide substrate;
- a gallium nitride buffer layer disposed on the nucleation layer, wherein a material of the gallium nitride buffer layer comprises doped carbon gallium nitride (C:GaN) or doped iron gallium nitride (Fe:GaN); and
- a stacked structure formed between the nucleation layer and the gallium nitride buffer layer, and the stacked structure comprises:
  - a plurality of silicon nitride ($SiN_x$) layers, wherein a first layer in the plurality of silicon nitride layers is in direct contact with the nucleation layer; and
  - a plurality of aluminum gallium nitride ($Al_xGa_{1-x}N$) layers, stacked alternately with the plurality of silicon nitride layers, wherein a topmost layer of the stacked structure is one of the aluminum gallium nitride layers which is in direct contact with the gallium nitride buffer layer.

10. The semiconductor epitaxy structure of claim 9, wherein a thickness of each of the plurality of silicon nitride layers is gradually reduced toward the gallium nitride buffer layer.

\* \* \* \* \*